US009244101B2

(12) United States Patent
Cohen et al.

(10) Patent No.: US 9,244,101 B2
(45) Date of Patent: *Jan. 26, 2016

(54) ELECTROCHEMICAL FABRICATION PROCESS FOR FORMING MULTILAYER MULTIMATERIAL MICROPROBE STRUCTURES

(75) Inventors: Adam L. Cohen, Los Angeles, CA (US); Ananda H. Kumar, Fremont, CA (US); Michael S. Lockard, Lake Elizabeth, CA (US); Dennis R. Smalley, Newhall, CA (US)

(73) Assignee: University of Southern California, Los Angeles, CA (US)

( * ) Notice: Subject to any disclaimer, the term of this patent is extended or adjusted under 35 U.S.C. 154(b) by 931 days.

This patent is subject to a terminal disclaimer.

(21) Appl. No.: 12/431,680

(22) Filed: Apr. 28, 2009

(65) Prior Publication Data

US 2009/0320990 A1    Dec. 31, 2009
US 2015/0368820 A9    Dec. 24, 2015

Related U.S. Application Data

(63) Continuation of application No. 11/029,221, filed on Jan. 3, 2005, now Pat. No. 7,531,077.

(60) Provisional application No. 60/533,897, filed on Dec. 31, 2003, provisional application No. 60/533,975, (Continued)

(51) Int. Cl.
  *C25D 5/02*     (2006.01)
  *C25D 5/48*     (2006.01)
(Continued)

(52) U.S. Cl.
  CPC .............. *G01R 3/00* (2013.01); *C23C 18/1605* (2013.01); *C23C 18/1651* (2013.01);
(Continued)

(58) Field of Classification Search
  CPC ............ C25D 1/003; C25D 5/48; C25D 5/02; C25D 5/022; C23C 28/02
  USPC .................... 205/118, 122, 170; 427/256, 258
  See application file for complete search history.

(56) References Cited

U.S. PATENT DOCUMENTS 3,832,632 A    8/1974    Ardezzone ................... 324/756
4,961,052 A    10/1990   Tada et al. .................... 324/158
(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, p. 161.

(Continued)

*Primary Examiner* — Edna Wong
(74) *Attorney, Agent, or Firm* — Dennis R. Smalley

(57) ABSTRACT

Some embodiments of the invention are directed to the electrochemical fabrication of microprobes which are formed from a core material and a material that partially coats the surface of the probe. Other embodiments are directed to the electrochemical fabrication of microprobes which are formed from a core material and a material that completely coats the surface of each layer from which the probe is formed including interlayer regions. These first two groups of embodiments incorporate both the core material and the coating material during the formation of each layer. Still other embodiments are directed to the electrochemical fabrication of microprobe arrays that are partially encapsulated by a dielectric material during a post layer formation coating process. In even further embodiments, the electrochemical fabrication of microprobes from two or more materials may occur by incorporating a coating material around each layer of the structure without locating the coating material in inter-layer regions.

5 Claims, 9 Drawing Sheets

Related U.S. Application Data filed on Dec. 31, 2003, provisional application No. 60/533,947, filed on Dec. 31, 2003, provisional application No. 60/533,948, filed on Dec. 31, 2003, provisional application No. 60/540,510, filed on Jan. 29, 2004.

(51) Int. Cl.

| | |
|---|---|
| C23C 28/02 | (2006.01) |
| G01R 3/00 | (2006.01) |
| G01R 1/067 | (2006.01) |
| H01L 21/48 | (2006.01) |
| C25D 1/00 | (2006.01) |
| C23C 18/16 | (2006.01) |

(52) U.S. Cl.
CPC ........... *C25D 1/003* (2013.01); *G01R 1/06716* (2013.01); *G01R 1/06744* (2013.01); *G01R 1/06755* (2013.01); *H01L 21/4853* (2013.01)

(56) References Cited

U.S. PATENT DOCUMENTS

| | | | |
|---|---|---|---|
| 5,020,219 A | 6/1991 | Leedy | 29/846 |
| 5,070,297 A | 12/1991 | Kwon et al. | 324/158 |
| 5,177,438 A | 1/1993 | Littlebury et al. | 324/754 |
| 5,190,637 A | 3/1993 | Guckel | 205/118 |
| 5,513,430 A | 5/1996 | Yanof et al. | 29/846 |
| 5,605,614 A | 2/1997 | Bornand | 205/50 |
| 5,772,451 A | 6/1998 | Dozier et al. | 439/70 |
| 5,806,181 A | 9/1998 | Khandros et al. | 29/874 |
| 5,820,014 A | 10/1998 | Dozier et al. | 228/56.3 |
| 5,829,128 A | 11/1998 | Eldridge et al. | 29/855 |
| 5,917,707 A | 6/1999 | Khandros et al. | 361/776 |
| 5,974,662 A | 11/1999 | Eldridge et al. | 29/842 |
| 5,994,152 A | 11/1999 | Eldridge et al. | 29/842 |
| 6,023,103 A | 2/2000 | Chang et al. | 257/781 |
| 6,027,630 A * | 2/2000 | Cohen | 205/135 |
| 6,043,563 A | 3/2000 | Eldridge et al. | 257/784 |
| 6,044,548 A | 4/2000 | Distefano et al. | 29/840 |
| 6,064,213 A | 5/2000 | Khandros et al. | 324/754 |
| 6,208,225 B1 | 3/2001 | Miller | 333/202 |
| 6,218,910 B1 | 4/2001 | Miller | 333/33 |
| 6,268,261 B1 * | 7/2001 | Petrarca et al. | 438/421 |
| 6,441,315 B1 | 8/2002 | Eldridge et al. | 174/260 |
| 6,456,099 B1 | 9/2002 | Eldridge et al. | 324/754 |
| 6,482,013 B2 | 11/2002 | Eldridge et al. | 439/66 |
| 6,483,328 B1 | 11/2002 | Eldridge et al. | 324/754 |
| 6,499,216 B1 | 12/2002 | Fjelstad | 29/842 |
| 6,509,751 B1 | 1/2003 | Mathieu et al. | 324/754 |
| 6,520,778 B1 | 2/2003 | Eldridge et al. | 439/66 |
| 6,539,531 B2 | 3/2003 | Miller et al. | 716/15 |
| 6,627,483 B2 | 9/2003 | Ondricek et al. | 438/117 |
| 6,640,415 B2 | 11/2003 | Eslamy et al. | 29/593 |
| 6,672,875 B1 | 1/2004 | Mathieu et al. | 439/66 |
| 6,690,185 B1 | 2/2004 | Khandros et al. | 324/758 |
| 6,690,186 B2 | 2/2004 | Fjelstad | 324/762 |
| 6,705,876 B2 | 3/2004 | Eldridge | 439/66 |
| 6,713,374 B2 | 3/2004 | Eldridge et al. | 438/611 |
| 6,729,019 B2 | 5/2004 | Grube et al. | 29/830 |
| 6,817,052 B2 | 11/2004 | Grube | 15/3 |
| 6,838,893 B2 | 1/2005 | Khandros, Jr. et al. | 324/754 |
| 6,838,894 B2 | 1/2005 | MacIntyre | 324/755 |
| 6,913,468 B2 | 7/2005 | Dozier, II et al. | 439/66 |
| 7,142,000 B2 | 11/2006 | Eldridge et al. | 324/765 |
| 7,531,077 B2 * | 5/2009 | Cohen et al. | 205/118 |
| 2003/0186405 A1 | 10/2003 | Lee et al. | 435/182 |
| 2004/0007470 A1 | 1/2004 | Smalley | 205/118 |
| 2004/0072452 A1 | 4/2004 | Eldridge et al. | 439/69 |
| 2004/0112637 A1 * | 6/2004 | Kim et al. | 174/264 |
| 2005/0029225 A1 | 2/2005 | Zhang | 216/40 |
| 2005/0045585 A1 | 3/2005 | Zhang et al. | 216/58 |
| 2005/0142846 A1 | 6/2005 | Frodis et al. | 438/622 |
| 2005/0148214 A1 | 7/2005 | Mathieu et al. | 439/67 |
| 2005/0179458 A1 | 8/2005 | Chen et al. | 324/762 |
| 2005/0184748 A1 | 8/2005 | Chen et al. | 324/761 |
| 2006/0006888 A1 | 1/2006 | Kruglick et al. | 324/754 |
| 2006/0216920 A1 * | 9/2006 | Kojima | 438/618 |
| 2011/0132767 A1 * | 6/2011 | Wu et al. | 205/118 |
| 2012/0228143 A1 * | 9/2012 | Cohen | 205/118 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 1999, p. 244.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

* cited by examiner

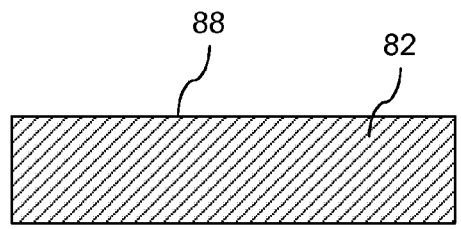
FIG. 4A
(PRIOR ART)
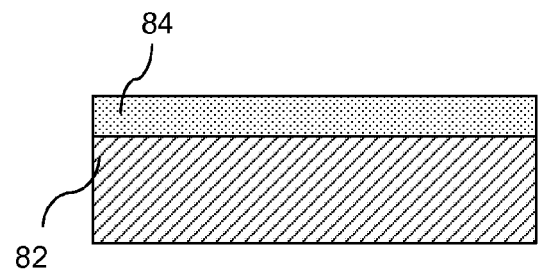
FIG. 4B
(PRIOR ART)
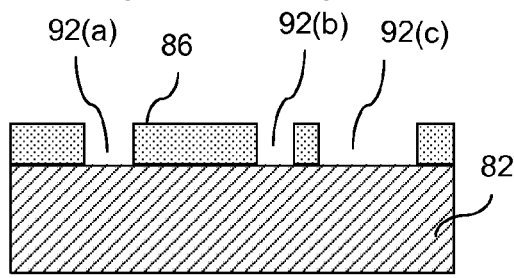
FIG. 4C
(PRIOR ART)
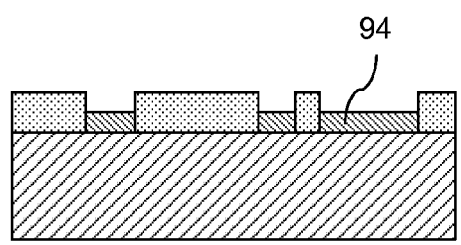
FIG. 4D
(PRIOR ART)
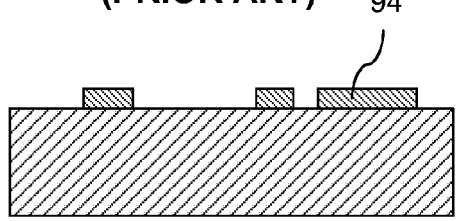
FIG. 4E
(PRIOR ART)
FIG. 4F
(PRIOR ART)
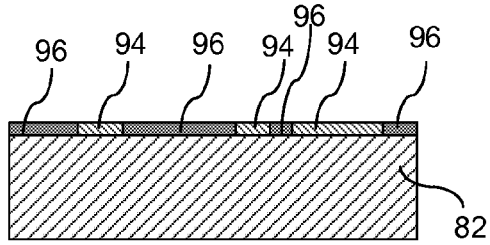
FIG. 4G
(PRIOR ART)
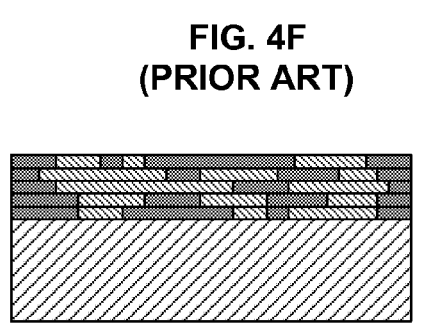
FIG. 4H
(PRIOR ART)
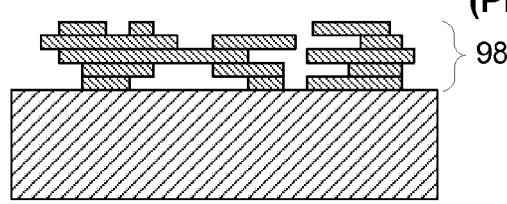
FIG. 4I
(PRIOR ART)

ELECTROCHEMICAL FABRICATION PROCESS FOR FORMING MULTILAYER MULTIMATERIAL MICROPROBE STRUCTURES

RELATED APPLICATIONS

This application is a continuation of U.S. patent application No. 11/029,221, filed Jan 3, 2005, now U.S. Patent No. 7,531,077, which claims benefit to U.S. Provisional Patent Application Nos. 60/533,897, 60/533,975, 60/533,947, 60/533,948, each filed on Dec 31, 2003; and to 60/540,510, filed Jan 29, 2004. Each of these provisional applications is incorporated herein by reference as if set forth in full herein.

FIELD OF THE INVENTION

The present invention relates generally to the field of Electrochemical Fabrication and the associated formation of three-dimensional structures (e.g. microscale or mesoscale structures). In particular, some embodiments are focused on the electrochemical fabrication of multilayer multimaterial probe elements (i.e. compliant electronic contact elements).

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica® Inc. (formerly MEMGen Corporation) of Van Nuys, Calif. under the name EFAB®. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica® Inc. (formerly MEMGen Corporation) of Van Nuys, Calif. such masks have come to be known as INSTANT MASKS™ and the process known as INSTANT MASK-ING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application, pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

(1) Selectively depositing at least one material by electrodeposition upon one or more desired regions of a substrate.

(2) Then, blanket depositing at least one additional material by electrodeposition so that the additional deposit covers both the regions that were previously selectively deposited onto, and the regions of the substrate that did not receive any previously applied selective depositions.

(3) Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Even though electrochemical fabrication as taught and practiced to date, has greatly enhanced the capabilities of microfabrication, and in particular added greatly to the number of metal layers that can be incorporated into a structure and to the speed and simplicity in which such structures can be made, room for enhancing the state of electrochemical fabrication exists

SUMMARY OF THE INVENTION

It is an object of some embodiments of the invention to provide an enhanced electrochemical process for working with multiple structural materials.

It is an object of some embodiments of the invention to provide an enhanced electrochemical process for forming structures (e.g. compliant electrical contact elements, e.g. microprobes) that include an outer coating of a secondary structural material surrounding or at least partially surrounding a primary structural material.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object of the invention ascertained from the teachings herein. It is not necessarily intended that all objects be addressed by any single aspect of the invention even though that may be the case with regard to some aspects.

In a first aspect of the invention, a process for forming a multilayer three-dimensional structure, e.g. a probe structure or an array of probe structures, includes: (a) forming and adhering a layer of material to a previously formed layer and/or to a substrate; (b) repeating the forming and adhering operation of (a) to build up a three-dimensional structure from a plurality of adhered layers, wherein the formation of at least a plurality of layers comprises the deposition of at least one sacrificial material and two structural materials at least one of which at least partially encapsulates the other; and (c) after formation of a plurality of layers, separating at least a portion of the sacrificial material on a plurality of layers from the structural materials on those layers.

In a second aspect of the invention, a process for forming a multilayer three-dimensional structure, e.g. a probe structure or an array of probe structures, includes: (a) forming and adhering a layer of material to a previously formed layer and/or to a substrate; (b) repeating the forming and adhering operation of (a) to build up a three-dimensional structure from a plurality of adhered layers, wherein the formation of at least a plurality of layers comprises the deposition of at least two structural materials, at least one of which isolates other from the sacrificial material; and (c) after formation of a plurality of layers, separating at least a portion of the sacrificial material on a plurality of layers from the structural materials on those layers.

In a third aspect of the invention, a process for forming a multilayer three-dimensional structure, e.g. a probe structure or an array of probe structures, includes: (a) forming and adhering a layer of material to a previously formed layer and/or to a substrate; (b) repeating the forming and adhering operation of (a) to build up a three-dimensional structure from a plurality of adhered layers, wherein the formation of at least a plurality of layers comprises the deposition of at least two structural materials, at least one of which is a dielectric material, and the deposition of a sacrificial material; and (c) after formation of a plurality of layers, separating at least a portion of the sacrificial material on a plurality of layers from the structural materials on those layers.

In a fourth aspect of the invention, a process for forming a multilayer three-dimensional structure, e.g. a probe structure or an array of probe structures, includes: (a) forming and adhering a layer of material to a previously formed layer and/or to a substrate; (b) repeating the forming and adhering operation of (a) to build up a three-dimensional structure from a plurality of adhered layers, wherein a plurality of layers comprise a desired pattern of at least one structural material and at least one sacrificial material; (c) after formation of a plurality of layers, separating at least a portion of the sacrificial material on a plurality of layers from the structural material on those layers; and (d) at least partially surrounding a plurality of probe elements of the probe array with a dielectric material in regions removed from tips of the probe elements.

In a fifth aspect of the invention, a process for forming a multilayer three-dimensional structure, e.g. a probe structure or an array of probe structures, includes: (a) forming and adhering a layer of material to a previously formed layer and/or to a substrate; (b) repeating the forming and adhering operation of (a) to build up a three-dimensional structure from a plurality of adhered layers, wherein the formation of at least a plurality of layers comprises the deposition a sacrificial material and at least two structural materials, a first of which encapsulates a second wherein the encapsulating first material does not completely isolate regions of the second material form regions of second material on successive layers when those regions of second material at least partially overlap; and (c) after formation of a plurality of layers, separating at least a portion of the sacrificial material on a plurality of layers from the structural material on those layers.

Further aspects of the invention will be understood by those of skill in the art upon reviewing the teachings herein. Other aspects of the invention may involve apparatus that can be used in implementing one or more of the above process aspects of the invention. These other aspects of the invention may provide various combinations of the aspects, embodiments, and associated alternatives explicitly set forth herein as well as provide other configurations, structures, functional relationships, and processes that have not been specifically set forth above.

BRIEF DESCRIPTION OF THE DRAWINGS

FIGS. 4A-4I schematically depict the formation of a first layer of a structure using adhered mask plating where the blanket deposition of a second material overlays both the openings between deposition locations of a first material and the first material itself.

DETAILED DESCRIPTION OF PREFERRED EMBODIMENTS OF THE INVENTION

Figure 1A:
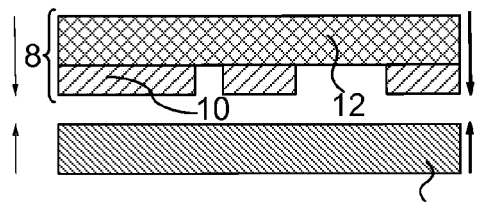
FIGS. 1A-1C schematically depict side views of various stages of a CC mask plating process, while FIGS. 1D-1G schematically depict a side views of various stages of a CC mask plating process using a different type of CC mask.
Figure 1B:
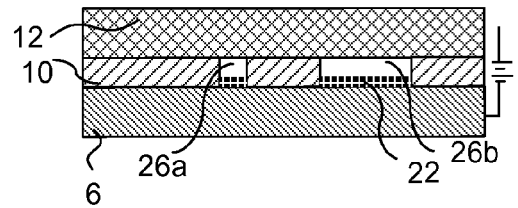
Figure 1C:
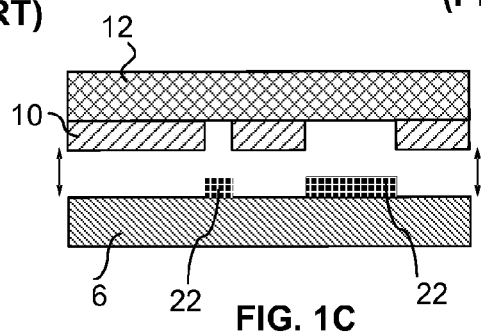
Figure 1D:
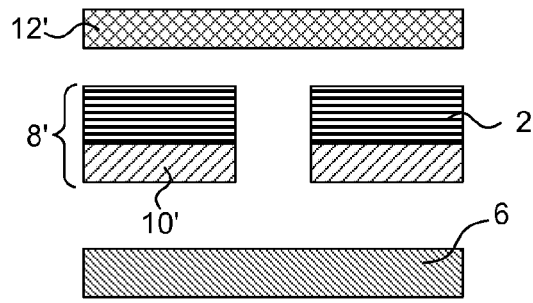
Figure 1E:
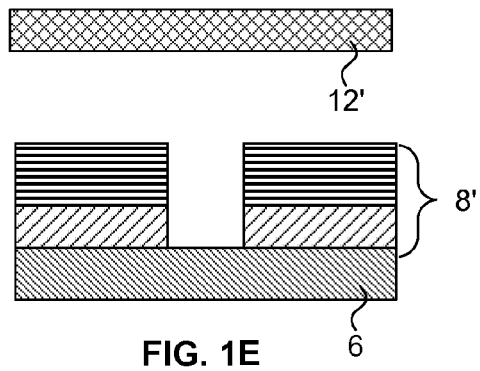
Figure 1F:
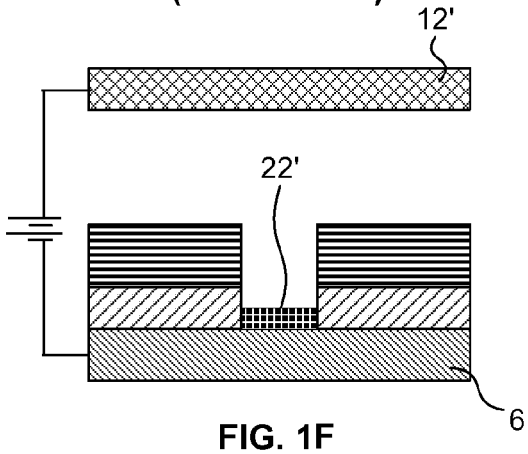
Figure 1G:
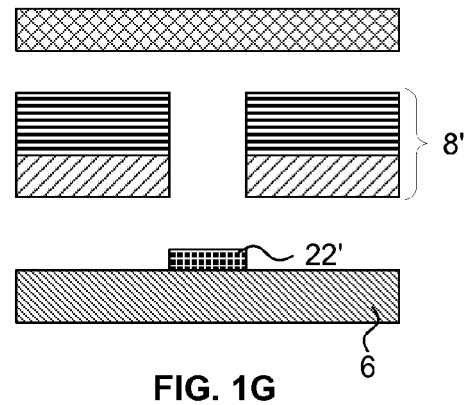
Figure 2A:
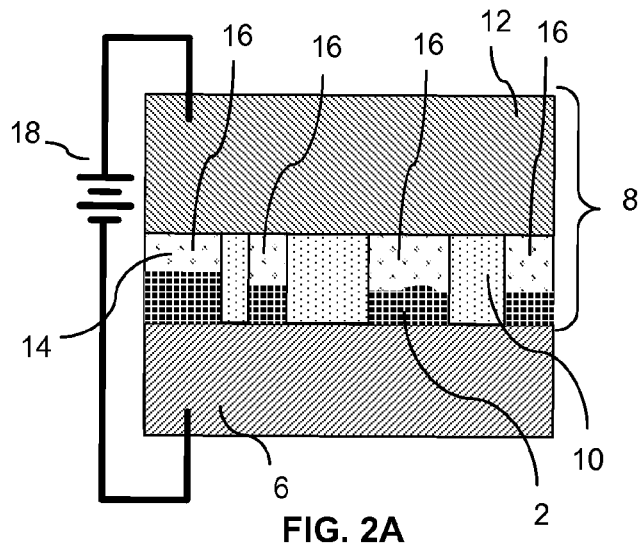
FIGS. 2A-2F schematically depict side views of various stages of an electrochemical fabrication process as applied to the formation of a particular structure where a sacrificial material is selectively deposited while a structural material is blanket deposited.
Figure 2B:
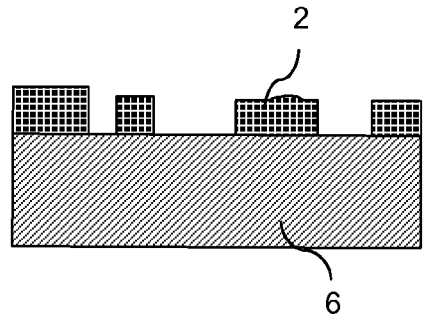
Figure 2C:
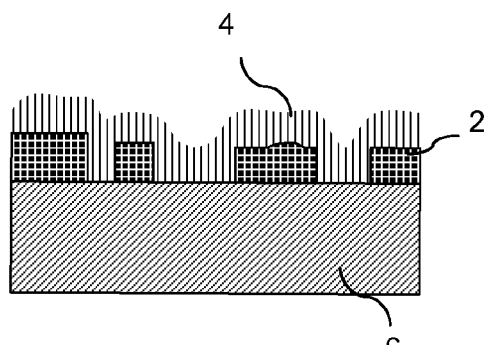
Figure 2D:
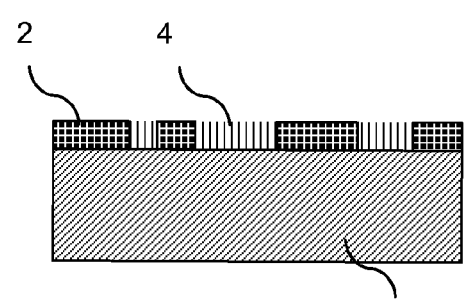
Figure 2E:
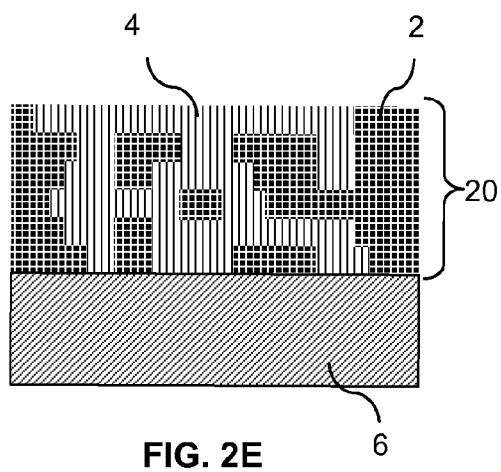
Figure 2F:
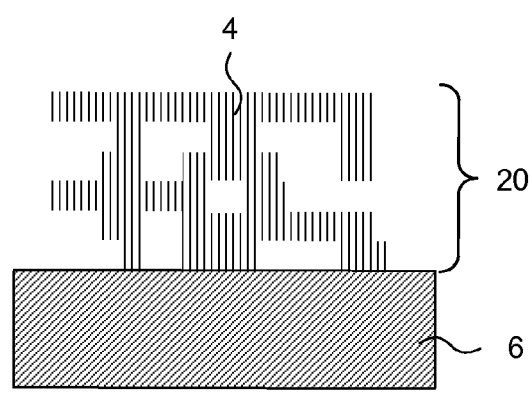
Figure 3A:
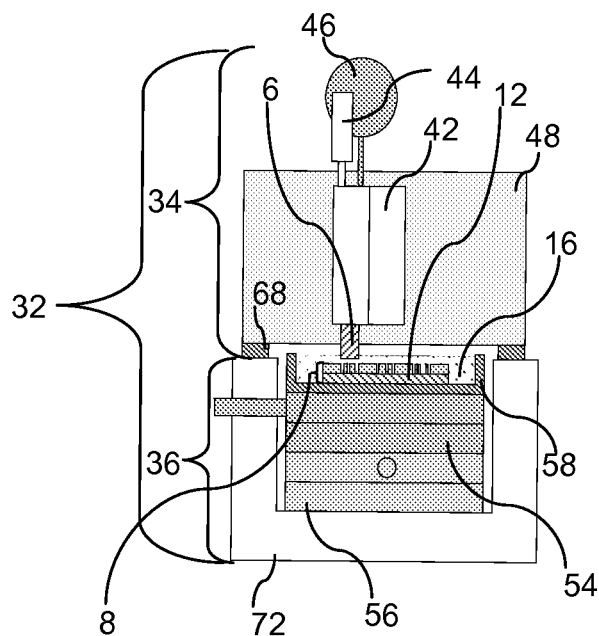
FIGS. 3A-3C schematically depict side views of various example subassemblies that may be used in manually implementing the electrochemical fabrication method depicted in FIGS. 2A-2F.
Figure 3B:
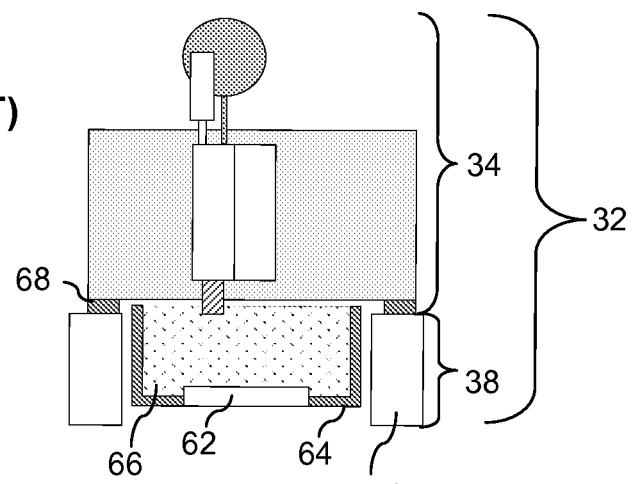
Figure 3C:
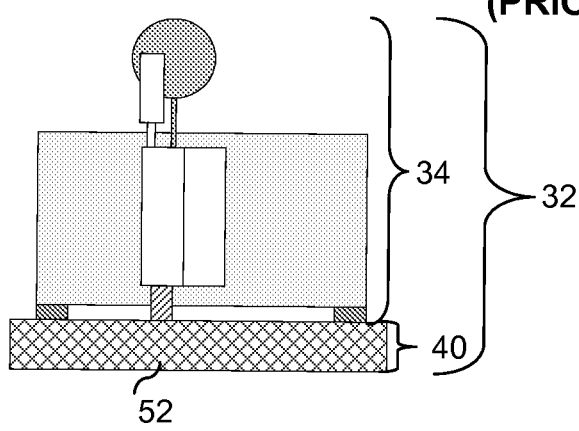

FIGS. 1A-1G, 2A-2F, and 3A-3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

The various embodiments, alternatives, and techniques disclosed herein may form multi-layer structures using a single patterning technique on all layers or using different patterning techniques on different layers. For example, different types of patterning masks and masking techniques may be used or even techniques that perform direct selective depositions without the need for masking. For example, conformable contact masks may be used on some layers while non-conformable contact masks and masking operations may be used on other layers. Proximity masks and masking operations (i.e. operations that use masks that at least partially selectively shield a substrate by their proximity to the substrate even if contact is not made) may be used, and adhered masks and masking operations (masks and operations that use masks that are adhered to a substrate onto which selective deposition or etching is to occur as opposed to only being contacted to it) may be used.

FIGS. 5A-5I and 6A-6K show process flows for two methods for producing microprobes comprised of two materials. The layer-by-layer two material processing approaches of FIGS. 5A-5I and 6A-6K may ensure a more uniform coating of the second material on the first material than may be achievable using a post layer formation coating technique (e.g., electroless plating) which may not produce a uniform coating (e.g., due to differences in agitation between regions close to the surface vs. close to the base of a dense probe array). In addition, these methods avoid the need for post-coating operations. FIGS. 7A-7F describe a method of incorporating an elastomeric matrix around probes.

Figure 5A:
FIGS. 5A-5I schematically depict side views of various states of a process for forming a sample probe according to a first embodiment of the invention where the probe is formed from a core material and a material that partially coats the surface of the probe.
Figure 5B:
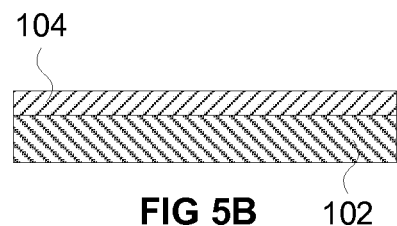
Figure 5C:
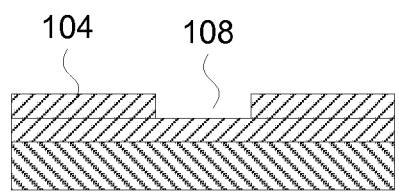
Figure 5D:
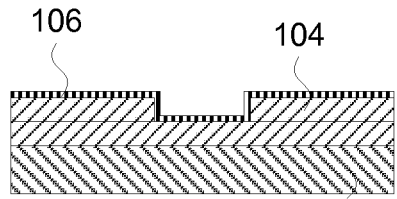
Figure 5E:
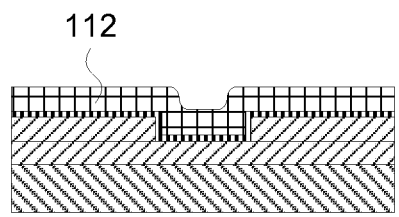
Figure 5F:
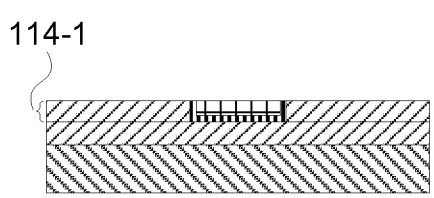
Figure 5G:
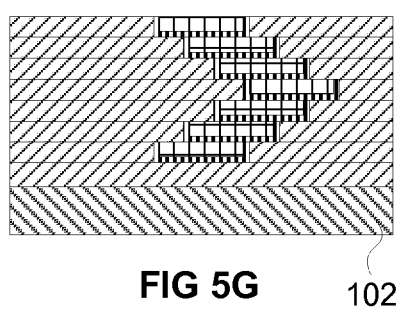

In FIG. 5A, a temporary substrate 102 is provided, and in FIG. 5B a layer of sacrificial material 104, e.g. Cu, is deposited and planarized. In FIG. 5C, a second level of the sacrificial material 104 has been plated selectively and in FIG. 5D, a coating material 106 (e.g., Au) is blanket deposited thinly (e.g., 1-3 μm) over the entire surface of the deposited materials. In some variations of the present embodiment the plating of the coating material 106 may occur in a selective manner by use of a mask that leaving openings over the void regions 108 in the sacrificial material. The thickness of the deposited coating material 106 is made significantly less than the height of the pattern-plated sacrificial material 104 so as to provide sufficient sacrificial material height to allow deposition of the probe structural material 112 (e.g., Ni—P) to occur in selected locations below a planarization level to which the deposits will be trimmed. The deposition of the structural material 112 is shown in FIG. 5E. In some variations of the present embodiment, the deposition of structural material 112 may occur in a selective manner. FIG. 5F shows the state of the process after the deposited materials have been planarized to define a layer 114-1 which include regions of structural material 112 and regions of sacrificial material 104 which are separated by thin deposit of coating material 106. FIG. 5G shows the state of the process after multiple layers have been formed using operations similar to those used in forming the first layer.

Figure 5H:
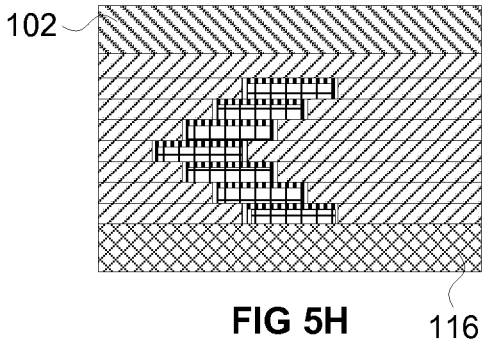
Figure 5I:
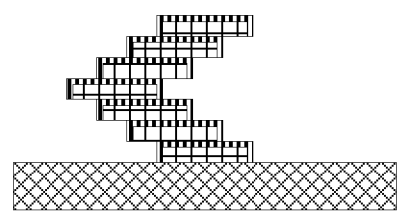

In FIG. 5H, the build has been transferred to and bonded (using solder or other bonding means not shown) to a space transformer or other substrate 116. In FIG. 5I, the formed structure comprised of structural material 112 and coatings of material 106 has been released from the sacrificial material 104 and from substrate 102. Since the coating material envelops the structural material on only three sides (as shown) out of four, the etchant used to attack the sacrificial material must not more than minimally attack both the coating material 106 and the structural material 112 which forms the core of the structure formed (e.g. of a probe structure). Examples of materials compatible with Cu etchants are Au, Ni, Ni—P, Ni—Co, and Sn. Probes made with a Ni or Ni alloy core and a Au coating will have mechanical properties similar to those made purely from Ni/Ni alloy (i.e., without a coating), but with lower overall resistance due to the Au coating. Probes made with an Au core and a Ni/Ni alloy coating, on the other hand, will likely have a lower spring constant than those made with Ni/Ni alloy cores, but may have a particularly low resistivity. The thickness of the coating relative to the thickness of the core material may be adjusted to tailor the mechanical and electrical properties of the probe. In applications where high frequency signals will be carried, it may be desirable to use a low resistance material (e.g., Au) as the coating material and a different material as the core material. It should also be noted that use of a high modulus material (e.g., Ni) as a coating material may bring enhanced modulus to the structure as a whole due to the larger distance of the high modulus material from the neutral axis of each layer.

Figure 6A:
FIGS. 6A-6K schematically depict side views of various states of a process for forming a sample probe according to a second embodiment of the invention where the probe is formed from a core material and a material that completely coats the surface of each layer of the probe.
Figure 6B:
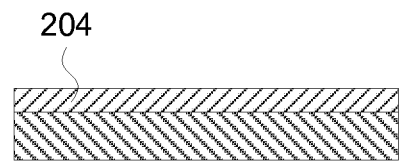
Figure 6C:
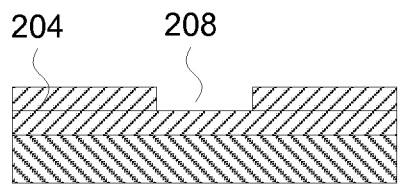
Figure 6D:
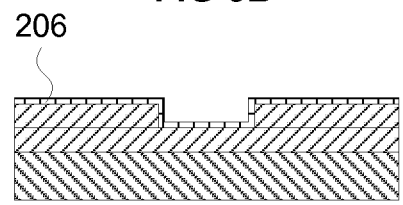
Figure 6E:
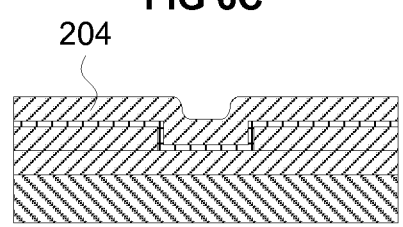

In FIGS. 6A-6K, a second embodiment of process for forming a two material probe is illustrated. In this second embodiment a two-material probe is produced while using only two materials in the build process. This is accomplished by fully encapsulating the material that will form the bulk of the structure within a coating material. In FIG. 6A, a temporary substrate 202 is provided. In FIG. 6B a layer of a sacrificial material 204 (e.g. Cu) has been deposited and planarized. In FIG. 6C, a second level of sacrificial material (e.g. Cu) has been selectively plated and then any patterning mask that used in selectively depositing the sacrificial material has been removed. In FIG. 6D, a coating material or structural material 206 is deposited as a thin coating. In some implementations of the present embodiment, the structural material may include, e.g., Ni, Ni—P, Ni—Co, and the like) which is blanket deposited to form a thin coating (e.g., 1-5 μm). As with variations of the first embodiment, in variations of this embodiment, the coating material may be deposited in a selective manner. The thickness of the deposited structural material 206 is made significantly less than the height of the pattern-plated sacrificial material so that another quantity of sacrificial material may be deposited into the void 208 in the pocket of structural material located within void 208 in the selectively deposited sacrificial such that the bulk of the material within the void 208 is sacrificial material which is surrounded by a coating of structural material as shown in FIG. 5E. In a variation of the present embodiment, rather than thinly blanket plating the structural material (i.e. thinner than the layer thickness) to form the bottom and sides of the layer, one could form the bottom as a thin layer of its own and the sides as narrow but layer thickness deep selective deposits of material (e.g. lithographically-defined) on a successive layer.

Figure 6F:
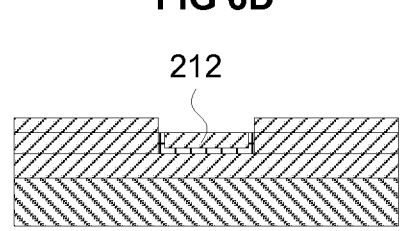
Figure 6G:
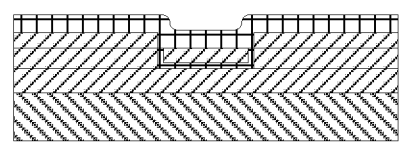
Figure 6H:
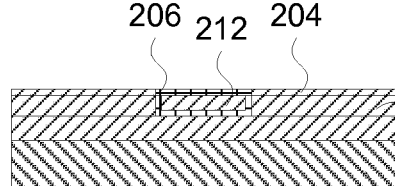

In FIG. 6F, the sacrificial material has been plated selectively as part of a process of forming a structural 'cap' for the structural region of the previously formed layer wherein the patterning of the deposition of the sacrificial material is selected to match or is at least based on the region of initial deposition of the sacrificial material associated with the previous layer. In variations of this embodiment, the cap may be made to be identical to the structural material region of the previous layer it may be made to extend beyond the region of the structural material if such an extension exists in the current layer. It is important to ensure that no gap exists in the structural material that surrounds the sacrificial material 212 (i.e. the "core" sacrificial material as distinguished from the sacrificial material 204 that will eventually be removed) that is intending to be encapsulated as such a gap could allow etching of the core sacrificial material 212. Since the only function of this layer is as a cap, it may be made as part of a layer that is thinner than the previous layer. FIG. 6G depicts the state of the process after deposition of the cap material on the cap layer occurs while FIG. 6H depicts the state of the process after a planarization process trims the cap material 206 and the deposited sacrificial material to complete formation of the thin cap layer.

In a variation of the embodiment, the plating of the cap material may be by pattern-plating of the structural material instead of by pattern plating the sacrificial material which is followed by blanket plating of the structural material. In some such variations (e.g. when the cap is made thin enough, e.g. 1-2 microns in thickness, the plating of the sacrificial material and the planarizing of the cap layer may become unnecessary. The slight topography induced by patterned plating of the cap material may not significantly interfere with fabrication of the next layer).

Figure 6I:
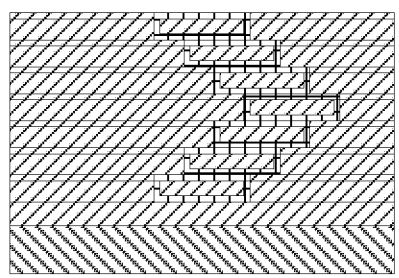
Figure 6J:
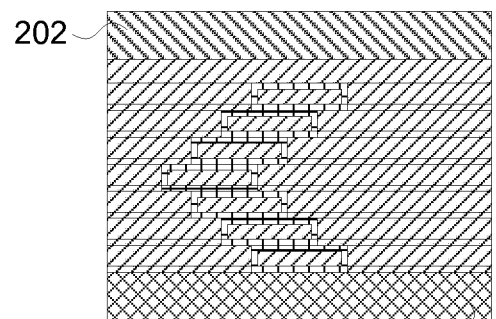
Figure 6K:
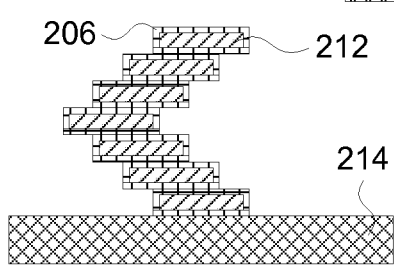

In FIG. 6I, the process is shown after multiple layers have been completed where every other layer is a thin cap layer that is planarized. In this example, the formation of the additional layers occurs via the same processes used in forming the layer of FIGS. 6C-6H. The last layer of the structure may or may not be followed by the formation of a capping layer (as shown in FIG. 6G no final capping layer was used). In FIG. 6J, the build is shown as having been transferred to and bonded to (solder or other bonding means not shown) a space transformer 214 or other substrate. In FIG. 6K, the non-encapsulated sacrificial material 204 has been separated from the structure leaving behind structural material 206 encapsulated sacrificial material 212. As with the embodiment of FIGS. 6A-6I before, the thickness of the structural material relative to the thickness of the core sacrificial material 112 may be adjusted to tailor the mechanical and electrical properties of the probe.

In some variations of the embodiment of FIGS. 6A-6K, the deposition of capping material (i.e. structural material) during the formation of a capping layer may not result in the capping material being deposited to all regions of the sacrificial material that is to be encapsulated. Instead the deposition of capping material may be limited to those regions where no structural material will exist on the next layer (but was intended to exist on the previous layer) where all other needed structural material will be deposited in association with the formation of the next layer. Still further alternative coating material depositions patterns can be advantageously defined.

In still other variations, deposition of coating material may occur in such a way as to locate the coating material completely around the external surfaces of the probes without locating the coating material between successive deposits of the encapsulated structural material. Such variations may be implemented on an nth layer using the following operations: (1) locate a masking material over those portions of a surface where sacrificial material is not to be located; (2) deposit the sacrificial material; (3) either remove those portions of the masking material which do not overlay structural material on a previous layer or alternatively removal all masking material and reapply masking material to those regions where structural material exists on the previous layer; (4) deposit a thin layer of the coating material; (5) remove the mask; (6) deposit a thick coating of structural material to be encapsulated; (7) planarize the deposits to the desired layer level; and (8) repeat operations (1)-(7) to form remaining layers of the structure. In a variation of this process, the regions defined for not receiving the encapsulating material may be somewhat smaller than the intersection (e.g. an eroded intersection region) of the structural material regions for the previous layer and the present layer (e.g. to ensure that no breaks in encapsulating material inadvertently occur in the layer-to-layer intersection regions.

In an alternative approach to the previous embodiment, the following operations may be used to ensure encapsulation while not inadvertently locating encapsulation material between layers of structural material: (1) locate a masking material over those portions of a surface where sacrificial material is not to be located; (2) deposit the sacrificial material; (3) deposit a thin layer of the coating material; (4) locate a patterned mask over at least the encapsulation material in those regions where it is to remain; (5) selectively etch away the thin layer of encapsulation material exposed via the openings in the mask (i.e. remove encapsulation material from regions where structural material will overlay structural material or at least on some reduced portion of that area); (6) remove the mask; (7) deposit a thick coating of structural material to be encapsulated; (8) planarize the deposits to the desired layer level; and (9) repeat operations (1)-(8) to form remaining layers of the structure.

It will be understood by those of skill in the art, based on the teachings herein, that in variations of the embodiments of FIGS. 5A-5I and 6A-6K, and in their various alternatives that have been set forth or that will be understood by those of skill in the art, that instead of building single probes, the embodiments may be extended to the formation of probe arrays and even pluralities of probe arrays (including different types of probe arrays). In still other embodiments, the methods may be applied to the production of devices other than to probes.

In some embodiments one of the encapsulation material or the core material may be a dielectric material. In some embodiments, more than two materials may be incorporated into the structure of the probes and even one or more additional probe tip or contact materials may incorporated into the tip regions of the probes.

Figure 7A:
FIGS. 7A-7F schematically depict side views of various states of a process for forming a sample probe array according to a third embodiment of the invention where the probe array is formed from a structural material which is partially encapsulated in a dielectric material via post-layer formation coating operations.
Figure 7B:
Figure 7C:
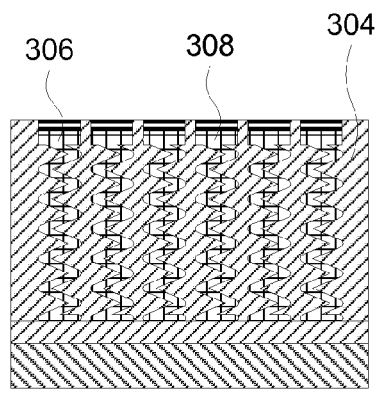
Figure 7D:
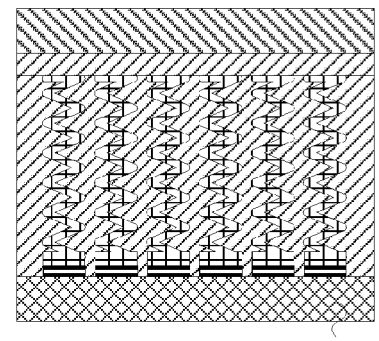
Figure 7E:
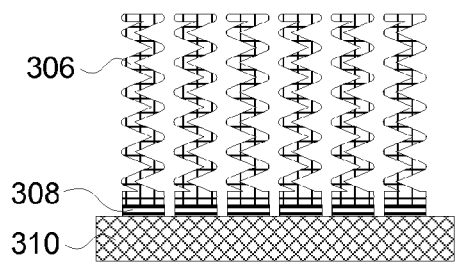
Figure 7F:
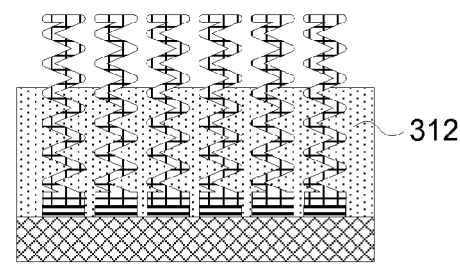

FIGS. 7A-7F depict various states of a process for producing a probe array which includes an elastomeric dielectric material as part of the structure. FIG. 7A depicts the state of the process after a temporary substrate 302 is supplied while FIG. 7B depicts the state of the process after an initial layer of sacrificial material 304 (e.g., Cu) has been deposited and planarized. In FIG. 7C, probes are shown as having been created (shown as springs in this example) from a structural material 306 where it is assumed that the creation process occurs using or more of a variety of possible electrochemical fabrication processes. In variations of this embodiment, other formation techniques may be used. The final layer in the formation of the structure results in the selective placement of a bonding or adhesion material 308, such as solder, to the ends of the probe elements. In FIG. 7D, the build (i.e. the partially formed structure) has been transferred and bonded to a space transformer or other substrate 310. In FIG. 7E, the sacrificial material 304 has been removed to release the formed structure (e.g. plurality of probes) from the confines of the sacrificial material and from the temporary substrate 302. Finally, in FIG. 7F, an elastomer 312 has been applied to the probes to envelop as least part of them after which it is cured. The elastomer can one or more of several functions: (1) it may increase the spring constant of the probes; (2) it may reduce risk of contact between neighboring probes; (3) it may prevent probe damage during tip cleaning (at which time the probe may be subject to lateral forces); and/or (4) it may ensured a stronger bonding of the probes to the space transformer. The elastomer prior to curing is preferably of low viscosity which can be applied by flooding (i.e., by immersing the probes and space transformer (protecting the latter) into a bath of elastomer to a desired depth. If the depth of immersion does not locate the elastomer to all desired locations, the elastomer may be made to travel to desired locations under the force of capillary wicking or the like. When capillary wicking is used to drive the elastomer to desired locations, the probes may be designed such that gaps between them and/or between structural material of a single probes are smaller near the space transformer than away from it; in such cases the capillary forces may cause elastomer to fill in the lower volumes of the probe array, at the expense of withdrawing material from the upper portions of the array. Another approach would be to protect the upper volumes of the probes (e.g., by dipping into a wax, lacquer, or other removable material) prior to immersing the probes into the elastomer or allowing the latter to wick in or be drawn in under vacuum; the protective material may then be removed (typically after the curing of the elastomer).

In some embodiments, a solid elastomer may increase the spring constant too much. In such cases, the elastomer may be made porous, either with closed or open (i.e., interconnected) pores, or may be a composite of elastomer and hollow microparticles which can be elastically deformed. If the primary goal is to stabilize the probes during tip cleaning, then in lieu of a permanent elastomer, a wax, lacquer, or other temporary material may be used, and then removed after tip cleaning.

In a fourth embodiment of the invention, a secondary structural material fully encapsulates each layer of a primary structural material. This encapsulation may allow the primary structural material to be selected from a broader group of materials. The electrical conductivity of the primary structural material may not be as relevant if it is coated by a good electrical conductor. The ability of the primary structural material to withstand attack from sacrificial material etchants becomes moot if the coating material provides such protection. The encapsulation result of this embodiment makes easy the use of structural material and sacrificial material combinations that were difficult or impossible using prior techniques. For example, copper may be used as a structural material with a gold coating while nickel may be used as a sacrificial material since etchants that may be used to remove nickel do not attack gold but do tend to attack copper. The encapsulation may serve any or all of the following purposes: a) protect the primary structural material during etching of sacrificial material; b) improve interlayer adhesion; c) decrease interlayer resistance; and d) prevent oxidation or other corrosion of surfaces of the primary structural material. This embodiment allows a single material to act as a primary structural material and as a sacrificial material simultaneously. This embodiment may have particular usefulness for applications where electrical conductive is important such as in RF applications and in microprobe applications.

FIGS. 8A-8H schematically depict side views of various states of a process for forming a structure, e.g. a probe array, according to a fourth embodiment of the invention where a secondary structural material fully encapsulates each layer of a primary structural material. It will be understood by those of skill in the art that though only the major steps or operations involved in the process will be discuss additional standard steps and operations may be performed (cleaning operations, activation operations, surface roughening operations, inspection operations, and the like). Though the description to follow deposits the sacrificial material first, alternative embodiments could be defined that would deposit the structural material first.

Figure 8A:
FIGS. 8A-8H schematically depict side views of various states of a process for forming a structure, e.g. a probe array, according to a fourth embodiment of the invention where a secondary structural material fully encapsulates each layer of a primary structural material.

FIG. 8A depicts the state of the process after a patterned deposition of a sacrificial material 402 occurs on a substrate 400. This may be performed using standard lithography steps through which a photoresist pattern is created. In this embodiment, the deposition itself is preferably an electrodeposition of the sacrificial material (e.g. nickel from a nickel-sulfamate bath) in thicknesses ranging from 0.5 µm to 30 µm. However, in alternative embodiments other metals may be used and different thicknesses which fall outside this example range may be used.

Figure 8B:
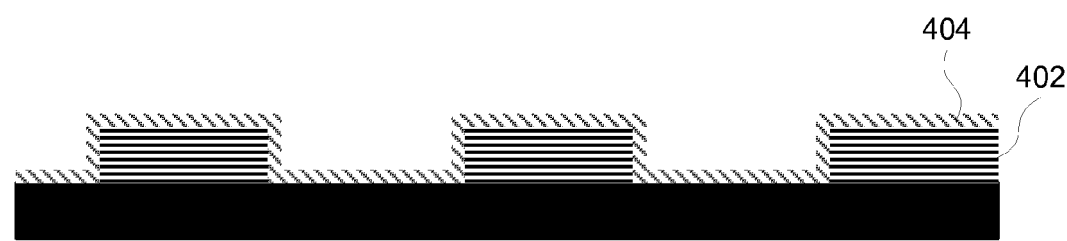

FIG. 8B depicts the state of the process after a thin blanket deposition of encapsulating material 404 occurs This step requires the deposition of a relatively thin, conforming layer of material (e.g. gold). In this embodiment, the deposition or coating may be applied by sputtering, for example at a thickness of about 500 Å. In other embodiments other materials may be used and other thicknesses may be used (e.g. from 50 Å to 2 µm). In other embodiments, other deposition techniques may be used, for example, evaporation, electroless deposition, electrolytic deposition, or even electroplating. In some embodiments, it may be advantageous to deposit an adhesion layer before or after application of the encapsulating material. Such an adhesion layer may have a thickness ranging from, for example, 10 Å-100 Å and may be of Ti or Cr. In still other alternative embodiments, other materials may be used, for example to act as diffusion barriers. For example, before or after a gold encapsulant is deposited (depending, for example, on which side copper is located), 10 Å to 100 Å of nickel may be deposited to act as a barrier to prevent the diffusion of the copper into the gold.

Figure 8C:
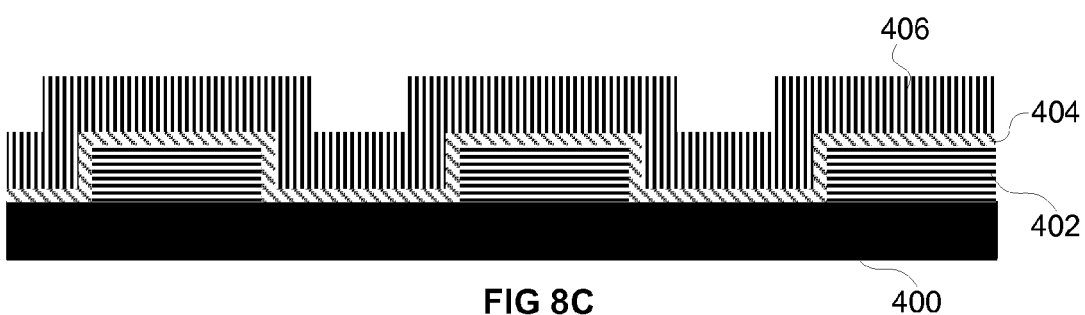

FIG. 8C depicts the state of the process after a blanket deposition of structural material 406 (e.g. copper) occurs. The deposition may occur via an electrodeposition process (e.g. deposition of copper from an acid-copper bath) or it may occur through other means (e.g., sputtering, evaporation, etc.) and other metals may be used. In some embodiments, a typical range of deposition thickness may be from 0.5 µm to 30 µm. As noted above, in some alternative embodiments, the structural and sacrificial materials may be the same (e.g., copper structural and sacrificial materials encapsulated by nickel and/or gold).

Figure 8D:

FIG. 8D depicts the state of the process after planarization occurs. This planarization step may take different forms, for example (1) lapping with a free abrasive, (2) lapping with a fixed abrasive, (3) grinding, or (4) fly cutting. One or more steps of planarization may be used in a progressive fashion.

Figure 8E:
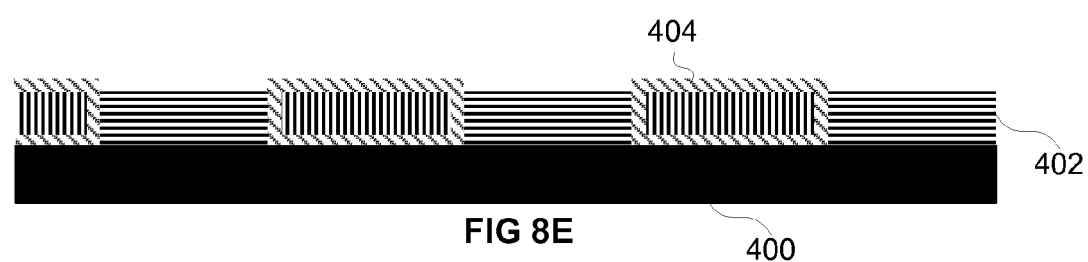

FIG. 8E depicts the result of a thin patterned deposition of encapsulating material 404 over the regions on the just completed layer that received the encapsulant 404 and the structural material 406. A mask for performing the patterned deposition may be obtained photolithographically from photomask that have substantially the inverse pattern to that used in operation leading to FIG. 8A. If on the other hand, the structural material is patterned deposited (rather than the sacrificial material), then the same pattern is used for FIG. 8A and FIG. 8E. The amount deposited should be kept as thin as possible (consistent with other objectives). In some alternative embodiments, instead of being overly concerned about excess thickness of the encapsulant, it may be possible to remove excess thickness of encapsulant by fly cutting or another planarization process. If necessary, prior to such trimming additional sacrificial material could be deposited to help protect the sidewalls of the encapsulant.

Figure 8F:
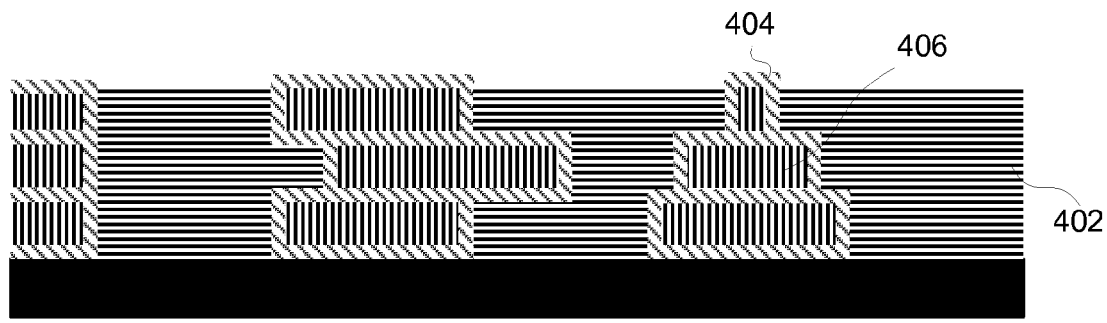

FIG. 8F depicts the state of the process after the operations of FIGS. 8A -8E are repeated two more times so as to produce the desired structure. In some embodiments, a structure may be formed in three layers as illustrated in this example, but in many situations additional layers are required (e.g. a total of 5 to 10 to 20 or even 40 layers or more may be necessary to form a structure of desired height and configuration. In this embodiment, it is assumed that the thickness of the encapsulant that is located on top of each layer is thin enough to not inference with operations used in forming the next layer.

Figure 8G:
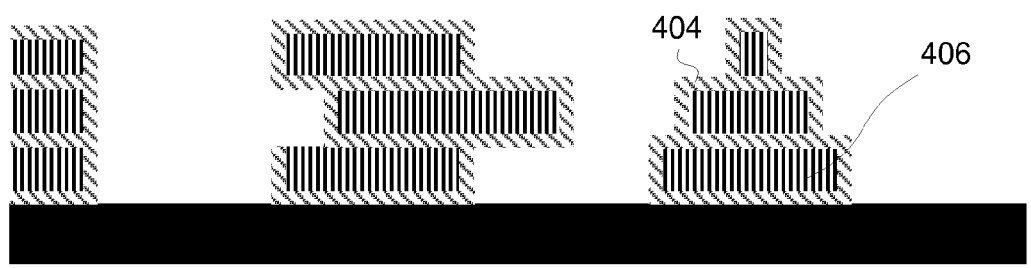

FIG. 8G depicts the state of the process after sacrificial material 402 is removed, e.g. by chemical etching.

Figure 8H:
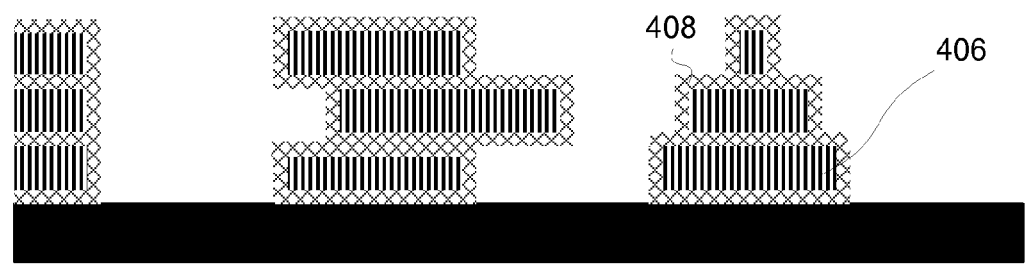

FIG. 8H depicts the state of the process after inter-diffusion of structural material and encapsulating material result in a modified coating 408. In some embodiments, it may be desirable to produce this inter-diffusion result while in other embodiments it may be something to be avoided (e.g. by using barrier layers and/or selection of substantially non-inter-diffusing material pairs, e.g. such as nickel and copper, or the like. If inter-diffusion is desired, those of skill in the art can empirically determine most appropriate treatment conditions and time depending on their objectives, the materials involved, and the like, e.g. desirable material properties may be obtained by heating to 600° C. for fifteen minutes in a reducing atmosphere.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use selective deposition processes or blanket deposition processes on some layers that are not electrodeposition processes. Some embodiments may use nickel as a structural material while other embodiments may use different materials. For example, preferred spring materials include nickel (Ni), copper (Cu), beryllium copper (BeCu), nickel phosphorous (Ni—P), tungsten (W), aluminum copper (Al—Cu), steel, P7 alloy, palladium, molybdenum, manganese, brass, chrome, chromium copper (Cr—Cu), and combinations of these. Some embodiments may use copper as the structural material with or without a sacrificial material. Some embodiments may remove all of a sacrificial material while other embodiments may not.

Some embodiments may apply the fabrication processes disclosed herein to the protection of microprobes while other embodiments may apply these methods in the fabrication of other devices for other applications.

Some embodiments may employ mask based selective etching operations in conjunction with blanket deposition operations. Some embodiments may form structures on a layer-by-layer basis but deviate from a strict planar layer on planar layer build up process in favor of a process that interlacing material between the layers. Such alternating build processes are disclosed in U.S. application Ser. No. 10/434,519, now U.S. Pat. No. 7,252,861, filed on May 7, 2003, entitled Methods of and Apparatus for Electrochemically Fabricating Structures Via Interlaced Layers or Via Selective Etching and Filling of Voids which is herein incorporated by reference as if set forth in full.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384, now abandoned, which was filed May 7, 2004 by Cohen et al. which is entitled "Method of Electrochemically Fabricating Multilayer Structures Having Improved Interlayer Adhesion" and which is hereby incorporated herein by reference as if set forth in full. This applications hereby incorporated herein by reference as if set forth in full.

Further teaching about microprobes and electrochemical fabrication techniques are set forth in a number of U.S. patent applications which were filed on Dec. 31, 2003. These Filings include: (1) U.S. Patent Application No. 60/533,933, by Arat et al. and which is entitled "Electrochemically Fabricated Microprobes"; (2) U.S. Patent Application No. 60/533,975, by Kim et al. and which is entitled "Microprobe Tips and Methods for Making"; (3) U.S. Patent Application No. 60/533,947, by Kumar et al. and which is entitled "Probe Arrays and Method for Making"; and (4) U.S. Patent Application No. 60/533,948, by Cohen et al. and which is entitled "Electrochemical Fabrication Method for Co-Fabricating Probes and Space Transformers". These patent filings are each hereby incorporated herein by reference as if set forth in full herein.

The techniques disclosed explicitly herein may benefit by combining them with the techniques disclosed in U.S. patent application No. 11/029,180, now abandoned, filed Jan. 3, 2005, by Chen et al. and entitled "Pin-Type Probes for Contacting Electronic Circuits and Methods for Making Such Probes"; U.S. patent application No. 60/641,341 filed Jan. 3, 2005 by Chen et al. and entitled "Vertical Microprobes for Contacting Electronic Components and Method for Making Such Probes"; U.S. patent application No. 11/029,217, now U.S. Pat. No. 7,412,767, filed Jan. 3, 2005 by Kim et al. and entitled "Microprobe Tips and Methods For Making"; and U.S. patent application No. 11/029,958, now abandoned, filed Jan. 3, 2005 by Kumar et al. and entitled "Probe Arrays and Methods for Making". and U.S. patent application No. 11/029,221, filed Jan. 3, 2005, by Cohen et al. and entitled "Electrochemical Fabrication Process for Forming Multilayer Multimaterial Microprobe Structures", now U.S. Pat. No. 7,531,077.

Further teachings about planarizing layers and setting layers thicknesses and the like are set forth in the following U.S. patent applications which were filed Dec. 31, 2003: (1) U.S. Patent Application No. 60/534,159 by Cohen et al. and which is entitled "Electrochemical Fabrication Methods for Producing Multilayer Structures Including the use of Diamond Machining in the Planarization of Deposits of Material" and (2) U.S. Patent Application No. 60/534,183 by Cohen et al. and which is entitled "Method and Apparatus for Maintaining Parallelism of Layers and/or Achieving Desired Thicknesses of Layers During the Electrochemical Fabrication of Structures". These patent filings are each hereby incorporated herein by reference as if set forth in full herein.

The techniques disclosed explicitly herein may benefit by combining them with the techniques disclosed in U.S. patent application Ser. No. 11/029,220, U.S. Pat. No. 7,271,888, filed concurrently herewith by Frodis et al. and entitled "Method and Apparatus for Maintaining Parallelism of Layers and/or Achieving Desired Thicknesses of Layers During the Electrochemical Fabrication of Structures".

Additional teachings concerning the formation of structures on dielectric substrates and/or the formation of structures that incorporate dielectric materials into the formation process and possibility into the final structures as formed are set forth in a number of patent applications: (1) U.S. Patent Application No. 60/534,184, by Cohen, which as filed on Dec. 31, 2003, and which is entitled "Electrochemical Fabrication Methods Incorporating Dielectric Materials and/or Using Dielectric Substrates"; (2) U.S. Patent Application No. 60/533,932, by Cohen, which was filed on Dec. 31, 2003, and which is entitled "Electrochemical Fabrication Methods Using Dielectric Substrates"; (3) U.S. Patent Application No. 60/534,157, by Lockard et al., which was filed on Dec. 31, 2004, and which is entitled "Electrochemical Fabrication Methods Incorporating Dielectric Materials"; (4) U.S. Patent Application No. 60/574,733, by Lockard et al., which was filed on May 26, 2004, and which is entitled "Methods for Electrochemically Fabricating Structures Using Adhered Masks, Incorporating Dielectric Sheets, and/or Seed Layers that are Partially Removed Via Planarization"; and U.S. Patent Application No. 60/533,895, by Lembrikov et al., which was filed on Dec. 31, 2003, and which is entitled "Electrochemical Fabrication Method for Producing Multilayer Three-Dimensional Structures on a Porous Dielectric".

These patent filings are each hereby incorporated herein by reference as if set forth in full herein.

The techniques disclosed explicitly herein may benefit by combining them with the techniques disclosed in U.S. patent application Ser. No. 11/029,216, now abandoned, filed Jan. 3, 2005 by Cohen et al. and entitled "Electrochemical Fabrication Methods Incorporating Dielectric Materials and/or Using Dielectric Substrates" and U.S. Patent Application No. 60/641,292 filed concurrently herewith by Dennis R. Smalley and entitled "Method of Forming Electrically Isolated Structures Using Thin Dielectric Coatings".

Furthermore, U.S. application Ser. No. 10/949,738 filed Sep. 24, 2004; Ser. No. 10/772,943, filed Feb. 4, 2004; 60/445,186, filed Feb. 4, 2003; 60/506,015, filed Sep. 24, 2003; and 60/536,865, filed Jan. 15, 2004 are incorporated herein by reference.

Many other alternative embodiments will be apparent to those of skill in the art upon reviewing the teachings herein. Further embodiments may be formed from a combination of the various teachings explicitly set forth in the body of this application. Even further embodiments may be formed by combining the teachings set forth explicitly herein with teachings set forth in the various applications and patents referenced herein, each of which is incorporated herein by reference.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A fabrication process for forming a multi-material, multi-layer three-dimensional structure, comprising:
    (a) providing an initial multi-material layer on a sacrificial material on a substrate;
    (b) forming and adhering a first successive multi-material layer to the initial multi-material layer and forming any additional successive multi-material layer or layers on and adhered to the first successive multi-material layer or to a subsequently formed successive multi-material layer to build up a three-dimensional structure from a plurality of adhered multi-material layers,
    wherein each multi-material layer comprises a first structural material and a sacrificial material,
    wherein at least one of the adhered multi-material layers further comprises a second structural material, and wherein the three-dimensional structure is formed from the first structural material and the second structural material;
    (c) after formation of the plurality of adhered multi-material layers, separating the sacrificial material forming part of each of the plurality of adhered multi-material layers to reveal the three-dimensional structure comprising the first structural material and the second structural material;
    wherein formation of the at least one multi-material layer of the plurality of adhered multi-material layers comprises formation of a first of at least two consecutive multi-material layers and comprises:
        1) selectively depositing the sacrificial material into a pattern of photoresist;
        2) removing the photoresist to yield at least one void that is surrounded on the side by the deposited sacrifical material;
        3) depositing the first structural material into the void to a thickness less than the thickness of the first of the at least two consecutive layers such that a portion of the at least one void remains that is surround on the bottom and sides by the deposited first structural material;
        4) depositing the second structural material to occupy the portion of the at least one void that remains after depositing the first structural material;
        5) planarizing the first structural material, the second structural material, and the sacrificial material to set a boundary level for the first of the at least two consecutive layers;
    wherein the second structural material is different from the first structural material; and
    wherein the formation of an additional multi-material layer of the at least two consecutive multi-material layers, which is different from the first of the at least two consecutive multi-material layers, comprises:
        1) depositing the sacrificial material and the first structural material for the additional multi-material layer onto a previously formed multi-material layer of the at least two consecutive multi-material layers and then planarizing the sacrificial material and the first structural material to set a boundary level for the additional multi-material layer of the at least two consecutive multi-material layers such that the second structural material deposited to occupy the portion of the at least one void is completely isolated from sacrificial material that is separated in step (c), and
    wherein the sacrificial material and first and second structural materials are metals and at least one of the depositing steps comprises an electrochemical deposition step.

2. The process of claim 1 wherein the second structural material is the same material as the sacrificial material.

3. The process of claim 1 wherein the first structural material, the second structural material, and the sacrificial material on the first of the at least two consecutive multi-material layers are all different materials.

4. The process of claim 1 wherein the first structural material forming part of at least two of the plurality of multi-materials layers are different materials.

5. The process of claim 1 wherein the depositing of each of the first and second structural materials forming the plurality of multi-material layers occurs by electroplating.

* * * * *